(12) United States Patent  
Scheuschner et al.

(10) Patent No.: US 8,970,223 B2  
(45) Date of Patent: Mar. 3, 2015

(54) APPARATUS FOR VLF-VOLTAGE TESTING OF CABLES

(71) Applicant: Hagenuk KMT Kabelmesstechnik GmbH, Radeburg (DE)

(72) Inventors: Sven Scheuschner, Radeburg (DE); Nico Stechemesser, Dresden (DE); Dirk Bechler, Dresden (DE); Christoph Gramsch, Dresden (DE); Torsten Berth, Moritzburg (DE)

(73) Assignee: Hagenuk KMT Kabelmesstechnik GmbH, Radeburg (DE)

( * ) Notice: Subject to any disclaimer, the term of this patent is extended or adjusted under 35 U.S.C. 154(b) by 316 days.

(21) Appl. No.: 13/662,673

(22) Filed: Oct. 29, 2012

(65) Prior Publication Data

US 2013/0106451 A1   May 2, 2013

(30) Foreign Application Priority Data

Oct. 27, 2011   (DE) .......................... 10 2011 117 491

(51) Int. Cl.
*G01R 31/00* (2006.01)
*G01R 31/02* (2006.01)

(52) U.S. Cl.
CPC .............. *G01R 31/00* (2013.01); *G01R 31/021* (2013.01)

USPC .................. 324/543; 324/539; 324/750.01

(58) Field of Classification Search
USPC ..................... 324/539, 543, 750.01
See application file for complete search history.

(56) References Cited

U.S. PATENT DOCUMENTS

| 4,825,171 | A | 4/1989 | Lefeldt |
| 4,866,392 | A | 9/1989 | Lefeldt |
| 5,521,493 | A * | 5/1996 | Persons ................. 324/762.01 |
| 6,169,406 | B1 | 1/2001 | Peschel |
| 2005/0007122 | A1 * | 1/2005 | Oertel et al. ................. 324/543 |

FOREIGN PATENT DOCUMENTS

| DE | 36 29 352 | 7/1987 |
| DE | 37 00 647 | 4/1988 |
| DE | 37 37 373 | 10/1988 |
| DE | 38 05 733 | 9/1989 |
| DE | 195 13 441 | 10/1996 |

* cited by examiner

*Primary Examiner* — Vincent Q Nguyen  
(74) *Attorney, Agent, or Firm* — W. F. Fasse

(57) ABSTRACT

An apparatus for testing a cable or other capacitive load object with a VLF alternating cosine square, rectangular or trapezoidal test voltage, includes one or two DC voltage sources and a switching arrangement controlled by a measuring and control unit, to produce the test voltage with alternating switched polarity. The apparatus further includes a choke coil serving as an energy store, which is controlled by a switching element to be activated if the voltage/time slope arising during the switch-over after a respective half-wave of the test voltage falls below a defined threshold value.

20 Claims, 2 Drawing Sheets

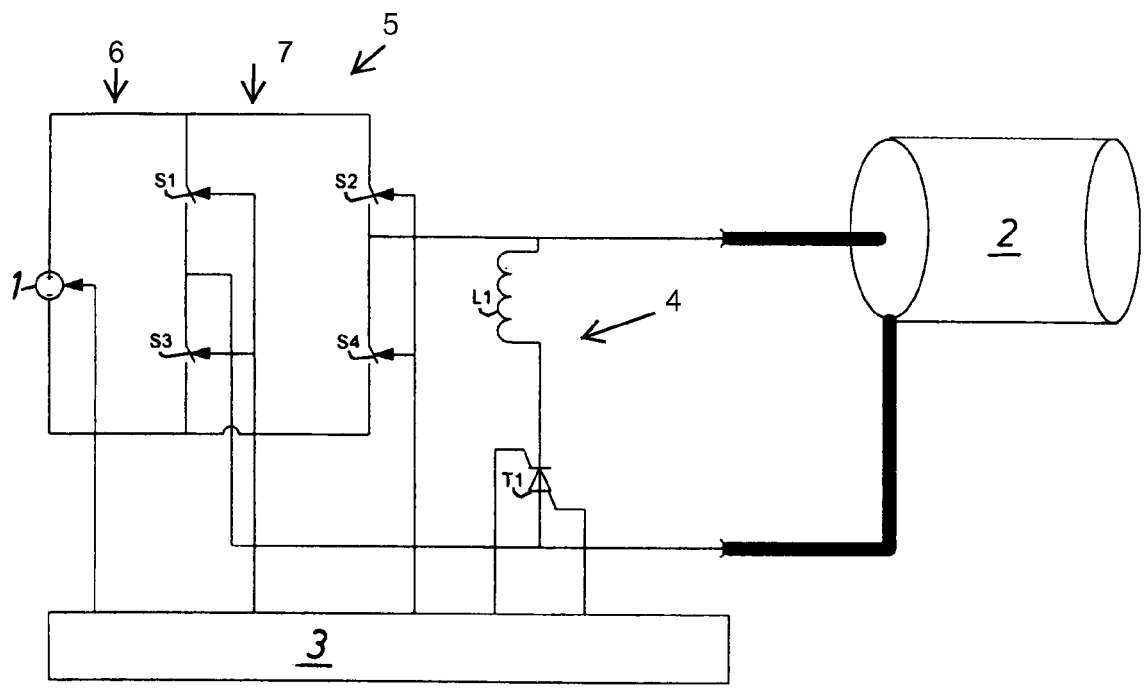
FIG. 1
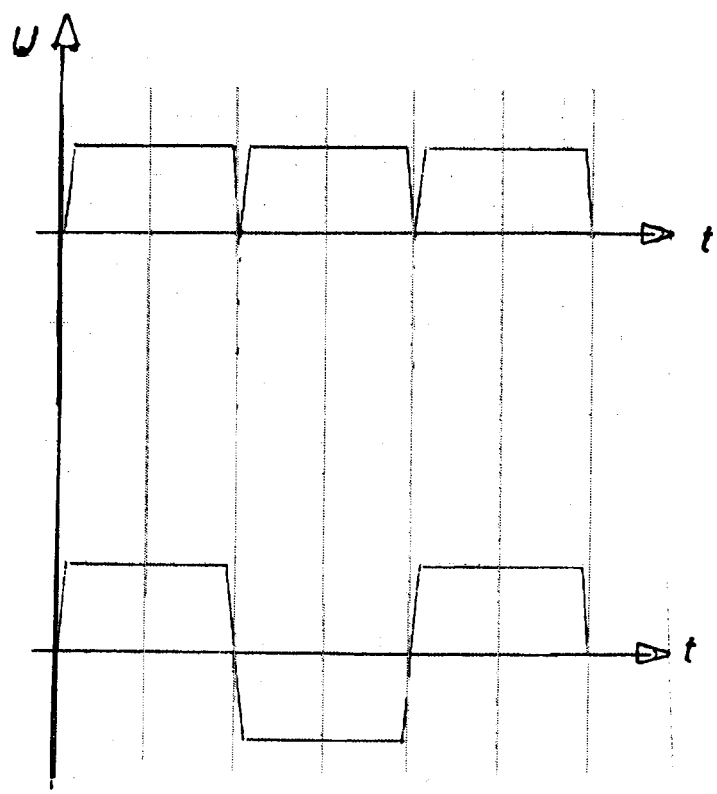
FIG. 2A
FIG. 2B

APPARATUS FOR VLF-VOLTAGE TESTING OF CABLES

PRIORITY CLAIM

This application is based on and claims the priority under 35 USC 119 of German Patent Application 10 2011 117 491.9, filed on Oct. 27, 2011, the entire disclosure of which is incorporated herein by reference.

FIELD OF THE INVENTION

The invention relates to an apparatus for testing cables or other test objects presenting a capacitive load, using a VLF alternating test voltage. VLF indicates Very Low Frequency, e.g. frequencies less than or equal to 0.1 Hz.

BACKGROUND INFORMATION

It is known to apply a VLF alternating voltage to an electrical system or component presenting a capacitive load, to carry out a so-called voltage stress test, proof test or withstand test of the integrity of the insulation of the component, as well as further types of testing. For example, such testing is applied to shielded cables, dielectric cables, or buried power cables, and especially medium voltage cables, among other test objects. Various different voltage source arrangements and switching arrangements are known for generating a VLF test voltage for testing cables. For example, the German Patent Publication DE 36 29 352 C1 discloses a switching arrangement for generating a cosine rectangular wave test voltage for such cable testing. This arrangement uses a rotating electromechanical switch for carrying out the switching function. An advantage of that arrangement is that, during the voltage polarity reversal or switchover, a load change rate du/dt comparable to the power main's frequency arises for the cable to be tested. On the other hand, disadvantages of that switching arrangement are that the rotating electromechanical switch is very subject to mechanical wear, that an asymmetrical cable loading arises because the polarity reversal or alternation losses are compensated only in the negative phase, and that an auxiliary high voltage backup or smoothing capacitor is necessary for low testing power levels.

Furthermore, the German Patent Publication DE 195 13 441 A discloses a switching arrangement which similarly demonstrates the generation of a VLF test voltage. Also, the German Patent Publications DE 37 00 647 A, DE 37 37 373 A and DE 38 05 733 A disclose other switching arrangements for generating test voltages for insulation testing of cables.

In the above known arrangements, a test voltage is used for generating sinusoidal voltages. However, due to the common functional or operating principle for carrying out the testing, it is disadvantageous in all of those arrangements, that the energy fed into the cable during charging in the first and third quadrants of one sinusoidal cycle of the voltage progression during the testing, must again be extracted from the test object i.e. the cable during the respective following discharge phases in the second and fourth quadrants of the given cycle of the m voltage progression. This discharged energy must then be converted into heat to be dissipated. As a result, such known arrangements suffer a relatively poor efficiency, which also limits the maximum testing power that can be realized.

SUMMARY OF THE INVENTION

In view of the above, it is an object of the invention to provide a simple testing apparatus of the above described general type, which has been further improved to have a simple construction and a compact structural size and configuration, and to achieve a high testing power. Furthermore, the apparatus aims to achieve long term reliability and a symmetrical cable loading behavior during the testing, and to avoid the need for an auxiliary backup or smoothing capacitor. The invention further aims to avoid or overcome the disadvantages of the prior art, and to achieve additional advantages, as apparent from the present specification. The attainment of these objects is, however, not a required limitation of the claimed invention.

The above objects have been achieved according to the invention in an apparatus for testing a test object such as a cable with a VLF voltage for generating a cosine square or rectangular or trapezoidal form test voltage. The apparatus includes a switched voltage supply arrangement, a measuring and control unit, and a backup circuit branch. The switched voltage supply arrangement includes a voltage source arrangement with at least one DC voltage source, and a switching arrangement with two or four switches. In one embodiment, the voltage source arrangement includes a single DC voltage source and the switching arrangement includes four switches that are controlled by the measuring and control unit to alternately connect opposite poles of the single DC voltage source to the output terminals of the apparatus, which results in an alternating cosine rectangular or trapezoidal wave test voltage on the cable being tested. The four switches form a bridge circuit with two switches in each of two bridge circuit branches. As an equivalent alternative, two three-terminal switches can be used. In another embodiment, the voltage source arrangement includes two DC voltage sources arranged anti-parallel i.e. with opposite polarity relative to one another, and the switching arrangement includes two parallel-arranged switches that alternately connect the first or the second DC voltage source with respective opposite polarity to the two output terminals of the apparatus to result in the alternating cosine voltage with rectangular or square or trapezoidal wave shape. As an equivalent alternative, a single three-terminal switch can be used.

Furthermore, in both embodiments the measuring and control unit monitors the voltage/time slope du/dt (which is actually to be understood as the absolute value of du/dt) during the polarity reversal switch-over after a respective half-wave of the test voltage, and if this voltage/time slope (absolute value) falls below a defined threshold value, then the measuring and control unit activates a controlled switching element to allow current to flow between the output terminals through an inductive element or choke coil as an energy store or reservoir. This controlled switching element and the associated choke coil are components of the backup circuit branch. Thereby, if the voltage/time slope during the polarity reversal switch-over of the test voltage, as driven by the DC voltage source is insufficient for a higher capacitance load (e.g. a longer cable), then the choke coil is connected as an energy store or reservoir. An advantage of this arrangement is that an expensive and relatively large auxiliary backup or smoothing capacitor is not necessary. Furthermore, with this arrangement a direct voltage supply from the DC voltage source is possible for short cables having relatively low capacitance loads, whereby the choke coil of the backup circuit branch remains inactive, i.e. is not circuit-connected through the switching element controlled by the measuring and control unit. On the other hand, if a cable with a higher capacitance is to be tested, such that the voltage rise or voltage/time slope du/dt achieved directly by the DC voltage source itself falls below the defined threshold value of du/dt, due to the limited power output of the DC voltage source, then the choke coil is automatically connected into the circuit as an energy store and thus as an additional energy source.

In a particular advantageous embodiment of the invention, the controlled switching element in the backup circuit branch is a bipolar semiconductor switch or particularly a bipolar transistor. This avoids issues of wear and other disadvantages of electromechanical switches.

Furthermore, the measuring and control unit is connected and adapted to selectively switch-off or reduce the voltage of the DC voltage source(s) during each polarity reversal switch-over phase, if desired, in order to avoid problems such as arcing in the switching arrangement and to advantageously form the transitions between the alternating square or rectangular wave voltage pulses, e.g. resulting in a somewhat trapezoidal shaped waveform.

BRIEF DESCRIPTION OF THE DRAWINGS

In order that the invention may be clearly understood, it will now be described in detail in connection with example embodiments thereof, with reference to the accompanying drawings, wherein:

FIG. 1 is a schematic circuit diagram of a test apparatus according to a first embodiment of the invention with a single DC voltage source;

FIGS. 2A and 2B are schematic diagrams showing the voltage U over time t, to demonstrate the transformation from a substantially DC (or pulsed DC) supply voltage to an alternating cosine rectangular (or trapezoidal) wave test voltage;

Figure 3:
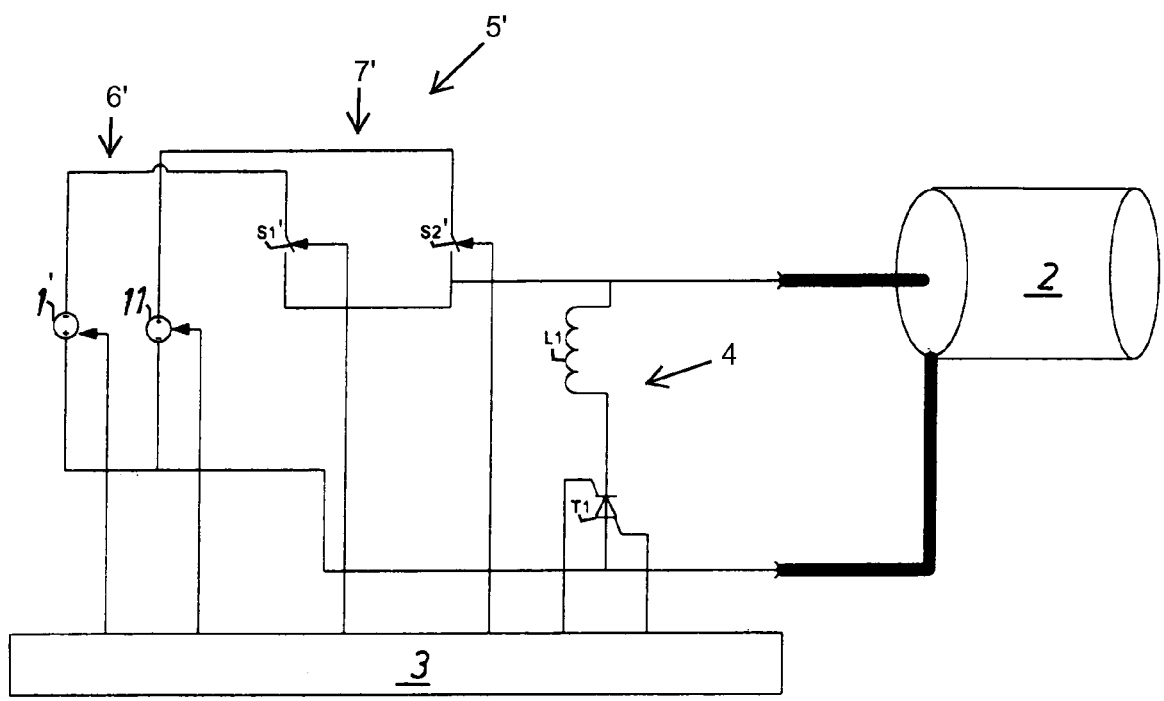
FIG. 3 is a schematic circuit diagram of a test apparatus according to a second embodiment of the invention with two DC voltage sources arranged with opposite polarity.

DETAILED DESCRIPTION OF PREFERRED EXAMPLE EMBODIMENTS AND THE BEST MODE OF THE INVENTION

In the first embodiment of the invention according to FIG. 1, the apparatus for testing the test object, i.e. a cable 2 to be tested, includes a switched voltage supply arrangement 5, a measuring and control unit 3, and a backup circuit branch 4. The backup circuit branch 4 includes a switching element T1, such as preferably a bipolar semiconductor switching element, e.g. bipolar transistor, and an inductor or choke coil L1. The switched voltage supply arrangement 5 includes a voltage source arrangement 6 having a single DC voltage source 1, and a switching arrangement 7 having four switches S1, S2, S3 and S4 arranged in two bridge circuit branches of a bridge circuit. The two bridge circuit branches serve to alternately connect the DC voltage source 1 with alternating polarity to two output terminals of the apparatus, which in turn are to be connected to two conductors of the test cable 2 (e.g. the inner main conductor and the outer shield conductor). When the switch S1 and the switch S4 are closed, then the positive pole of the DC voltage source 1 is connected to the outer conductor of the test cable 2 and the negative pole of the DC voltage source 1 is connected to the center conductor of the test cable 2. On the other hand, in the alternate switching state, the switches S2 and S3 are closed but the switches S1 and S4 are opened, so that the positive pole of the DC voltage source 1 is connected to the center conductor of the test cable 2, and the negative pole of the DC voltage source 1 is connected to the outer conductor of the test cable 2.

The alternate switching of the switches S1, S2, S3 and S4 in the two branches of the bridge circuit of the switching arrangement 7 is controlled by the measuring and control unit 3, which is embodied in hardware and/or software in any manner that would be known or understood to achieve the functions required thereof. This unit 3 may include, for example, a timer device, adjustment and selection devices or inputs, a voltage detecting and measuring device, a memory or storage element or holding element to maintain a predefined or preselected threshold value of a voltage/time slope, a comparator, logic circuitry, a processor, calculating circuitry, user input devices, user output devices, a power supply, switching circuitry, control voltage outputs for actuating the switches and switching element, etc. The unit 3 may also be connected to the two output terminals of the apparatus for measuring the voltage there.

As a result of the alternate switching of the switching arrangement 7, the unipolar output of the DC voltage source 1, for example as represented in FIG. 2A, is converted into a bipolar VLF alternating cosine rectangular wave test voltage, for example as represented in FIG. 2B, which is then supplied via the two output terminals of the apparatus to the conductors of the test cable 2. FIG. 2A further shows that the DC output voltage of the DC voltage source 1 may be reduced or momentarily interrupted at the intended polarity reversal time points, for example under the control of the measuring and control unit 3, for which the unit 3 is connected to the DC voltage source 1. Thereby, the voltage assumes a pulse form, and the voltage curve shape or voltage progression form of the VLF cosine rectangular test voltage can be advantageously adjusted as desired or needed, and problems such as voltage discontinuity and potential arcing at the switches of the switching arrangement 7 can be avoided.

As can be seen in FIG. 2B, a certain voltage rise or voltage/time slope du/dt occurs during the switching phase between the two alternating polarity states. The measuring and control unit 3 monitors and evaluates this voltage/time slope (among other things) and compares it (or the absolute value magnitude thereof) to a predefined threshold value. If the actual voltage/time slope is sufficient, i.e. meets or exceeds the predefined threshold value, then the test voltage provided by the DC voltage source 1 itself through the switching arrangement 7 is applied directly to the conductors of the test cable 2 for charging and/or discharging the cable. This will be the case when the connected cable 2 has a relatively low capacitance, e.g. is a relatively short cable. In this case the switching element T1 of the backup circuit branch 4 remains open, whereby the backup circuit branch 4 remains inactive.

On the other hand, if a cable 2 with a relatively higher capacitance (e.g. a longer cable) is to be tested, then the voltage/time slope du/dt arising from the voltage applied by the DC voltage source 1 may fall below the predefined threshold value due to the limited power output capacity of the voltage source 1. As a result, the arising voltage form will approximate a triangular wave rather than a rectangular (or trapezoidal) wave. This is measured, evaluated and recognized by the measuring and control unit 3, which then controls the arrangement so that no further charging or discharging of the test cable 2 is carried out. Instead, the polarity reversing process will be carried out by the backup circuit branch 4, namely the choke coil L1 as controlled by the switching element T1. Thereby, the choke coil L1 acts as an energy store, which, after a completed polarity reversal, again feeds the voltage with a phase reversal of 180° into the test cable 2. Then, the corresponding appropriate switches S1, S2, S3, S4 are closed by the control unit 3 such that the DC voltage source 1 is again connected so as to compensate the losses that arose during the polarity alternation or reversal process. Thereby, the choke coil L1 is controlledly circuit-connected to the two output terminals of the apparatus, parallel to the switched voltage supply arrangement 5, to provide additional energy to supplement that of the DC voltage source 1, so that the voltage/time slope du/dt arising during the switch-over or polarity alternation is sufficient to at least meet the minimum required threshold value. As a further option, one of plural choke coils with different inductances can be selected as needed depending on the capacitance of the cable to be tested.

FIG. 3 shows a second embodiment of the invention that is similar to the above embodiment of FIG. 1, except that the switched voltage supply arrangement 5' includes a voltage source arrangement 6' with two DC voltage sources, namely a first DC voltage source 1' and a second DC voltage source 11, and the switching arrangement 7' includes two switches S1' and S2'. The first and second DC voltage sources 1' and 11 are arranged anti-parallel to one another, with their polarities opposite one another. The switch S1' is connected in series with the first voltage source 1' and the switch S2' is connected in series with the second voltage source 11. By alternate closing of the switches S1' and S2', the respective opposite polarities of the voltage sources 1' and 11 are alternately connected to the test cable 2. Otherwise the structure and operation of the apparatus are the same as that described above for FIG. 1.

Figure 4:
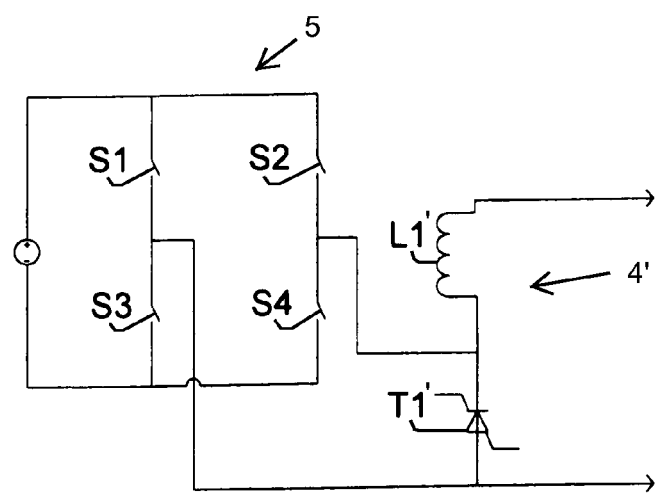
FIG. 4 is a schematic circuit diagram of a further variant of a test apparatus according to the embodiment of FIG. 1, but with the voltage supply connected in the middle of the backup circuit branch between the controlled switching element and the choke coil, i.e. parallel to the switching element.

In FIGS. 1 and 3, the switched voltage supply arrangement 5 or 5' is connected to the two conductors of the test cable 2 parallel to the backup circuit branch 4. In a further variant shown in FIG. 4 in connection with the apparatus of the first embodiment described above, the switched voltage supply arrangement 5 is not connected parallel to the backup circuit m branch 4 as discussed and shown above. Instead, the supply voltage is fed to the middle of the backup circuit branch 4' between the switching element T1' and the choke coil L1', i.e. parallel to the switching element T1'. In this arrangement also, by appropriately sequencing the switching of the switching m element T1' and the switches S1, S2, S3, and S4, the extra energy stored in the choke coil L1 can be supplement or supplant the limited output capacity of the DC voltage source 1.

Although the invention has been described with reference to specific example embodiments, it will be appreciated that it is intended to cover all modifications and equivalents within the scope of the appended claims. It should also be understood that the present disclosure includes all possible combinations of any individual features recited in any of the appended claims. The abstract of the disclosure does not define or limit the claimed invention, but rather merely abstracts certain features disclosed in the application.

What is claimed is:

1. An apparatus for electrically testing a test object presenting a capacitive load, comprising:
   two output terminals adapted to be connected respectively to conductors of the test object;
   at least one DC voltage source connected to said output terminals;
   plural switches connected and interposed between said at least one DC voltage source and at least one of said output terminals;
   a backup circuit branch that includes a switching element and a choke coil, and that is connected to said output terminals; and
   a measuring and control unit that is connected to each one of said switches and to said switching element, wherein said measuring and control unit is adapted to control a switching state of each one of said switches such that a DC voltage output of said at least one DC voltage source is connected through said switches to said output terminals with a polarity of said DC voltage output alternating dependent on an alternation of the switching state of said switches, and wherein said measuring and control unit is adapted to control a switching state of said switching element so as to selectively activate and deactivate a flow of current through said switching element and said choke coil.

2. The apparatus according to claim 1, wherein said switching element of said backup circuit branch is a bipolar semiconductor switch.

3. The apparatus according to claim 1, wherein said switching element and said choke coil are connected in series with one another in said backup circuit branch.

4. The apparatus according to claim 3, wherein said backup circuit branch is connected between said two output terminals.

5. The apparatus according to claim 3, wherein said at least one DC voltage source and said plural switches together form a switched voltage supply arrangement having two supply outputs, which are respectively connected to said two output terminals, wherein said switched voltage supply arrangement is connected parallel to said backup circuit branch.

6. The apparatus according to claim 3, wherein said at least one DC voltage source and said plural switches together form a switched voltage supply arrangement having two supply outputs, a first one of which is connected to one of said output terminals and a second one of which is connected to said backup circuit branch between said switching element and said choke coil, wherein said switched voltage supply arrangement is connected parallel to said switching element of said backup circuit branch.

7. The apparatus according to claim 1, wherein said measuring and control unit is connected to said output terminals and is adapted to measure a voltage and a voltage/time slope (du/dt) across said output terminals, and said measuring and control unit is adapted to perform said control of said switching state of said switching element to activate said flow of current through said switching element and said choke coil in response to said voltage/time slope falling below a predefined threshold value during and/or directly following a changeover of said switching state of said switches.

8. The apparatus according to claim 1, wherein said measuring and control unit is adapted to perform said control of said switching state of said switches so as to transform said DC voltage output of said at least one DC voltage source into a VLF cosine rectangular wave or trapezoidal wave AC test voltage provided to said output terminals.

9. The apparatus according to claim 1, wherein said at least one DC voltage source includes a single DC voltage source, wherein said plural switches include a first switch, a second switch, a third switch and a fourth switch forming a switching bridge circuit, wherein said first and fourth switches are switched together so as to connect a first pole of said single DC voltage source to a first one of said output terminals and so as to connect a second pole of said single DC voltage source to a second one of said output terminals, and wherein said second and third switches are switched together so as to connect said first pole to said second output terminal and so as to connect said second pole to said first output terminal.

10. The apparatus according to claim 1, wherein said at least one DC voltage source includes a first DC voltage source and a second DC voltage source that each respectively have a first pole and a second pole of opposite polarity, wherein said plural switches include a first switch connected in series with said first DC voltage source and a second switch connected in series with said second DC voltage source, and wherein said DC voltage sources and said switches are circuit-connected so as to selectively connect either said first and second poles of said first DC voltage source respectively to first and second ones of said output terminals or said second and first poles of said second DC voltage source respectively to said first and second output terminals.

11. The apparatus according to claim 1, expressly excluding any and all capacitor element connected between said first and second output terminals.

12. The apparatus according to claim 1, expressly excluding any and all resistor element connected between said first and second output terminals.

13. The apparatus according to claim 1, wherein said measuring and control unit is connected to each one of said at least one DC voltage source and is adapted to switch off or reduce said DC voltage output of each one of said at least one DC voltage source respectively during a switchover period in which said switching state of said switches is to be switched.

14. An apparatus for VLF AC testing of a test object presenting a capacitive load, comprising:
- two output terminals to be connected to the test object;
- a switchable inductive circuit branch comprising a switching element and an inductive element connected in series with one another between said two output terminals;
- an alternating power source of cosine rectangular or trapezoidal wave VLF voltage connected to said switchable m inductive circuit branch; and
- a measuring and control unit connected and adapted so as to measure a voltage/time slope of a test voltage across said two output terminals during a polarity reversal transition period of said VLF voltage, and so as to change a switching state of said switching element in response to said voltage/time slope falling below a defined threshold value.

15. The apparatus according to claim 14, wherein said alternating power source is connected parallel to said switching element and said inductive element between said two output terminals.

16. The apparatus according to claim 14, wherein said alternating power source is connected parallel to said switching element and in series with said inductive element between said two output terminals.

17. The apparatus according to claim 14, wherein said alternating power source includes a single DC voltage source and a switching arrangement connected to and controlled by said measuring and control unit to alternate a switching state of said switching arrangement so as to alternately connect two poles of said DC voltage source with alternating polarity through said switching arrangement thereby providing said VLF voltage.

18. The apparatus according to claim 14, wherein said alternating power source includes two DC voltage sources and a switching arrangement connected to and controlled by said measuring and control unit to alternately connect one and then the other of said DC voltage sources with alternating polarity through said switching arrangement thereby providing said VLF voltage.

19. The apparatus according to claim 14, wherein said alternating power source includes at least one DC voltage source and a switching arrangement through which a connection polarity of said at least one DC voltage source is alternatingly reversed, wherein said measuring and control unit is connected to said switching arrangement and is adapted to control a switching state of said switching arrangement in coordination with controlling said switching state of said switching element.

20. A method of VLF AC testing a test object presenting a capacitive load, comprising:
a) providing a DC voltage;
b) alternately switching a polarity of said DC voltage to produce a cosine rectangular or trapezoidal wave VLF AC voltage;
c) applying said VLF AC voltage via test device outputs to said test object;
d) monitoring a voltage progression across said test device outputs, measuring a voltage/time slope of said voltage progression during a transition period in which said switching of said polarity occurs, and comparing said voltage/time slope to a defined threshold value;
e) when said comparing determines that said voltage/time slope falls below said defined threshold value, then closing a switching element to allow a current to flow between said test device outputs through an inductive element circuit-connected in parallel or in series with said VLF AC voltage between said test device outputs.

* * * * *